US012315999B2

(12) United States Patent
Brandenburg et al.

(10) Patent No.: US 12,315,999 B2
(45) Date of Patent: May 27, 2025

(54) SOLDERABLE WAVEGUIDE ANTENNA

(71) Applicant: Aptiv Technologies AG, Schaffhausen (CH)

(72) Inventors: Scott D. Brandenburg, Kokomo, IN (US); David Wayne Zimmerman, Noblesville, IN (US); Michael J. Pepples, Noblesville, IN (US); Kevin Paul McReynolds, Noblesville, IN (US)

(73) Assignee: APTIV TECHNOLOGIES AG, Schaffhausen (CH)

( * ) Notice: Subject to any disclaimer, the term of this patent is extended or adjusted under 35 U.S.C. 154(b) by 185 days.

(21) Appl. No.: 17/812,770

(22) Filed: Jul. 15, 2022

(65) Prior Publication Data
US 2024/0022001 A1 Jan. 18, 2024

(51) Int. Cl.
*H01Q 13/06* (2006.01)
*H01Q 1/22* (2006.01)
(Continued)

(52) U.S. Cl.
CPC .......... *H01Q 13/06* (2013.01); *H01Q 1/2283* (2013.01); *H01Q 1/526* (2013.01); *H05K 1/0243* (2013.01);
(Continued)

(58) Field of Classification Search
CPC .......... H01Q 1/36; H01Q 1/2283; H01Q 1/50; H01Q 1/526; H01Q 13/06; H01Q 1/3323;
(Continued)

(56) References Cited

U.S. PATENT DOCUMENTS 3,462,713 A   8/1969   Knerr
3,579,149 A   5/1971   Ramsey
(Continued)

FOREIGN PATENT DOCUMENTS

CA    2654470 A1   12/2007
CN    1620738 A    5/2005
(Continued)

OTHER PUBLICATIONS

"Foreign Office Action", EP Application No. 20166797.9, Jun. 9, 2023, 6 pages.
(Continued)

*Primary Examiner* — Hoang V Nguyen
(74) *Attorney, Agent, or Firm* — Harness, Dickey & Pierce, P.L.C.

(57) ABSTRACT

Described herein is a waveguide that is configured to be soldered to a printed circuit board (PCB) via one or more metallic portions disposed thereon. Additionally, the waveguide may have solder disposed within through holes that is configured to conduct heat from one or more components of the PCB when the waveguide is mounted to the PCB. Also described herein is an assembly comprising the waveguide soldered to the PCB via solder between the metallic portions of the waveguide and metallic portions of the PCB. Techniques for producing the waveguide and the assembly are also described herein. By soldering the waveguide to the PCB, an inexpensive, precise, and secure mechanical bonding may be achieved while electrically sealing features of the waveguide and/or components of the PCB. Furthermore, the solder within the through holes allows for better heat conduction through the waveguide.

6 Claims, 5 Drawing Sheets

(51) Int. Cl.
*H01Q 1/52* (2006.01)
*H05K 1/02* (2006.01)
*H05K 3/34* (2006.01)

(52) U.S. Cl.
CPC ..... *H05K 3/34* (2013.01); *H05K 2201/10098* (2013.01)

(58) Field of Classification Search
CPC ................. H05K 1/0243; H05K 3/34; H05K 2201/10098
USPC ........................................................ 343/841
See application file for complete search history.

(56) References Cited

U.S. PATENT DOCUMENTS

| | | |
|---|---|---|
| 4,157,516 A | 6/1979 | Grijp |
| 4,453,142 A | 6/1984 | Murphy |
| 4,562,416 A | 12/1985 | Sedivec |
| 5,400,220 A | 3/1995 | Swamy |
| 5,432,487 A | 7/1995 | Dydyk |
| 5,867,073 A | 2/1999 | Weinreb et al. |
| 5,982,256 A | 11/1999 | Uchimura et al. |
| 5,986,527 A | 11/1999 | Ishikawa et al. |
| 6,340,113 B1 * | 1/2002 | Avery ................. B23K 35/025 228/248.1 |
| 6,489,855 B1 | 12/2002 | Kitamori et al. |
| 6,794,950 B2 | 9/2004 | Toit et al. |
| 6,867,660 B2 | 3/2005 | Kitamori et al. |
| 6,958,662 B1 | 10/2005 | Salmela et al. |
| 7,973,616 B2 | 7/2011 | Shijo et al. |
| 7,994,879 B2 | 8/2011 | Kim et al. |
| 8,013,694 B2 | 9/2011 | Hiramatsu et al. |
| 8,089,327 B2 | 1/2012 | Margomenos et al. |
| 8,159,316 B2 | 4/2012 | Miyazato et al. |
| 8,692,731 B2 | 4/2014 | Lee et al. |
| 9,007,269 B2 | 4/2015 | Lee et al. |
| 9,450,281 B2 | 9/2016 | Kim |
| 9,673,532 B2 | 6/2017 | Cheng et al. |
| 9,935,065 B1 | 4/2018 | Baheti et al. |
| 10,468,736 B2 | 11/2019 | Mangaiahgari |
| 10,775,573 B1 | 9/2020 | Hsu et al. |
| 10,833,385 B2 | 11/2020 | Mangaiahgari |
| 2002/0021197 A1 | 2/2002 | Elco |
| 2002/0158722 A1 * | 10/2002 | Maruhashi ............... H01P 5/185 333/246 |
| 2004/0069984 A1 | 4/2004 | Estes et al. |
| 2006/0113598 A1 | 6/2006 | Chen et al. |
| 2008/0129409 A1 | 6/2008 | Nagaishi et al. |
| 2008/0150821 A1 | 6/2008 | Koch et al. |
| 2009/0168367 A1 | 7/2009 | Fujii |
| 2009/0207090 A1 | 8/2009 | Pettus et al. |
| 2009/0243762 A1 | 10/2009 | Chen et al. |
| 2010/0182107 A1 | 7/2010 | Margomenos et al. |
| 2011/0057741 A1 | 3/2011 | Dayan et al. |
| 2011/0163919 A1 * | 7/2011 | Suzuki ................. H05K 1/0237 361/818 |
| 2012/0013421 A1 | 1/2012 | Hayata |
| 2012/0050125 A1 | 3/2012 | Leiba et al. |
| 2012/0068316 A1 | 3/2012 | Ligander |
| 2012/0163811 A1 | 6/2012 | Doany et al. |
| 2012/0176285 A1 | 7/2012 | Morgia |
| 2012/0194303 A1 | 8/2012 | Pettus et al. |
| 2012/0242421 A1 | 9/2012 | Robin et al. |
| 2012/0256796 A1 | 10/2012 | Leiba |
| 2013/0027195 A1 | 1/2013 | Wiemeersch et al. |
| 2013/0057358 A1 | 3/2013 | Anthony et al. |
| 2013/0214981 A1 | 8/2013 | Tsutsumi et al. |
| 2014/0015709 A1 | 1/2014 | Shijo et al. |
| 2014/0091884 A1 | 4/2014 | Flatters |
| 2014/0106684 A1 | 4/2014 | Burns et al. |
| 2015/0070160 A1 | 3/2015 | Davidsson et al. |
| 2015/0097633 A1 | 4/2015 | Devries et al. |
| 2015/0148989 A1 | 5/2015 | Cooper et al. |
| 2015/0229017 A1 | 8/2015 | Suzuki et al. |
| 2015/0285998 A1 | 10/2015 | Babakhani et al. |
| 2015/0310624 A1 | 10/2015 | Bulan et al. |
| 2015/0338299 A1 | 11/2015 | Eckert et al. |
| 2015/0357698 A1 | 12/2015 | Kushta |
| 2015/0364804 A1 | 12/2015 | Tong et al. |
| 2015/0364830 A1 | 12/2015 | Tong et al. |
| 2016/0023526 A1 | 1/2016 | Lavoie |
| 2016/0043455 A1 | 2/2016 | Seler et al. |
| 2016/0049714 A1 | 2/2016 | Ligander et al. |
| 2016/0072991 A1 | 3/2016 | Dinev |
| 2016/0118705 A1 | 4/2016 | Tang et al. |
| 2016/0164189 A1 | 6/2016 | Jafarlou et al. |
| 2016/0204495 A1 | 7/2016 | Takeda et al. |
| 2016/0259745 A1 | 9/2016 | Asaka et al. |
| 2016/0276308 A1 * | 9/2016 | Min ...................... H01L 23/36 |
| 2016/0276727 A1 | 9/2016 | Dang et al. |
| 2016/0293557 A1 | 10/2016 | Topak et al. |
| 2016/0301125 A1 | 10/2016 | Kim et al. |
| 2016/0366770 A1 | 12/2016 | Merkle et al. |
| 2017/0084554 A1 | 3/2017 | Dogiamis et al. |
| 2017/0288313 A1 | 10/2017 | Chung et al. |
| 2017/0324135 A1 | 11/2017 | Blech et al. |
| 2018/0131084 A1 | 5/2018 | Park et al. |
| 2018/0226709 A1 | 8/2018 | Mangaiahgari |
| 2018/0233465 A1 | 8/2018 | Spella et al. |
| 2018/0261924 A1 | 9/2018 | Hill et al. |
| 2018/0284186 A1 | 10/2018 | Chadha et al. |
| 2018/0301820 A1 | 10/2018 | Bregman et al. |
| 2018/0316788 A1 | 11/2018 | Elliott |
| 2018/0342797 A1 | 11/2018 | Pan et al. |
| 2018/0343711 A1 | 11/2018 | Wixforth et al. |
| 2018/0351261 A1 | 12/2018 | Kamo et al. |
| 2019/0006743 A1 | 1/2019 | Kirino et al. |
| 2019/0013563 A1 | 1/2019 | Takeda et al. |
| 2019/0089042 A1 | 3/2019 | Purden et al. |
| 2019/0140344 A1 | 5/2019 | Kirino et al. |
| 2020/0021001 A1 | 1/2020 | Mangaiahgari |
| 2020/0235453 A1 | 7/2020 | Lang |
| 2020/0343612 A1 | 10/2020 | Shi |
| 2021/0036393 A1 | 2/2021 | Mangaiahgari |
| 2021/0074662 A1 * | 3/2021 | Moitzi ................... H01L 24/81 |
| 2021/0225719 A1 * | 7/2021 | Seler ................... H01L 21/4817 |
| 2021/0356504 A1 | 11/2021 | Bencivenni et al. |
| 2022/0109247 A1 | 4/2022 | Brandenburg et al. |
| 2022/0173490 A1 * | 6/2022 | Buijsman ............. H01Q 1/2283 |
| 2022/0247089 A1 * | 8/2022 | Hartner ................... H01P 5/107 |
| 2023/0275336 A1 * | 8/2023 | Wintermantel ........ G01S 13/931 343/700 R |
| 2023/0319981 A1 * | 10/2023 | Hollaender ............ H05K 1/182 361/760 |
| 2023/0345623 A1 * | 10/2023 | van Gemert ............ H01L 23/66 |

FOREIGN PATENT DOCUMENTS

| | | |
|---|---|---|
| CN | 2796131 | 7/2006 |
| CN | 201383535 | 1/2010 |
| CN | 103515682 A | 1/2014 |
| CN | 104900956 A | 9/2015 |
| CN | 105609909 A | 5/2016 |
| CN | 105680133 A | 6/2016 |
| CN | 105958167 A | 9/2016 |
| CN | 209389219 U | 9/2019 |
| DE | 102019200893 A1 | 7/2020 |
| DE | 102020211254 A1 | 3/2022 |
| EP | 2500978 A1 | 9/2012 |
| EP | 2843758 A1 | 3/2015 |
| EP | 3460903 A1 | 3/2019 |
| GB | 2489950 A | 10/2012 |
| JP | 2003289201 A | 10/2003 |
| KR | 20080044752 A | 5/2008 |
| WO | 2013189513 A1 | 12/2013 |
| WO | 2018003932 A1 | 1/2018 |

OTHER PUBLICATIONS

Extended European Search Report dated Dec. 21, 2023 (corresponding to EP 23163661.4).

(56) References Cited

OTHER PUBLICATIONS

"Extended European Search Report", EP Application No. 18153137.7, Jun. 15, 2018, 8 pages.
"Extended European Search Report", EP Application No. 20166797, Sep. 16, 2020, 11 pages.
"Foreign Office Action", CN Application No. 201810122408.4, Jun. 2, 2021, 15 pages.
"Foreign Office Action", CN Application No. 201810122408.4, Oct. 18, 2021, 19 pages.
Jankovic, et al., "Stepped Bend Substrate Integrated Waveguide to Rectangular Waveguide Transitions", Jun. 2016, 2 pages.
Wang, et al., "Mechanical and Dielectric Strength of Laminated Epoxy Dielectric Graded Materials", Mar. 2020, 15 pages.

* cited by examiner

SOLDERABLE WAVEGUIDE ANTENNA

BACKGROUND

Radio frequency (RF) waveguide antennas (e.g., waveguides) are often attached to printed circuit boards (PCB) for various reasons (e.g., packaging, signal preservation, cost). Conventional techniques of affixation often rely on screws (or other fasteners) or pressure sensitive adhesives (PSA). While such techniques may affix the waveguides to the PCBs, they often fail to do so in a cost effective and/or precise manner (e.g., with proper alignment and/or with proper standoff heights of one or more apertures relative to the PCBs).

SUMMARY

This document is directed to a solderable waveguide antenna, assemblies thereof, and associated methods. Some aspects described below include an RF waveguide. The RF waveguide has a plastic body with a waveguide channel that has an aperture configured to mate with a corresponding RF port of a PCB. The RF waveguide also has a plurality of dimples on one or more external surfaces of the plastic body and one or more waveguide metallic portions disposed on the dimples.

Some aspects described below include an assembly that includes a PCB with an RF port and one or more PCB metallic portions. The assembly also includes a waveguide that has a waveguide channel with an aperture aligned with the RF port of the PCB and one or more waveguide metallic portions disposed on one or more external surfaces of the waveguide. The waveguide metallic portions correspond to the PCB metallic portions. The assembly further includes solder disposed between the waveguide metallic portions and the PCB metallic portions.

Some aspects described below include a method. The method includes obtaining a plastic waveguide comprising a plurality of dimples and depositing solderable metal on the dimples to form one or more waveguide metallic portions. The method also includes obtaining a PCB comprising one or more PCB metallic portions and adhering solder balls to the waveguide metallic portions and/or the PCB metallic portions. The method further includes arranging the plastic waveguide proximate the PCB such that the solder balls are in contact with the waveguide metallic portions and the PCB metallic portions and applying heat to the PCB or the plastic waveguide effective to melt the solder balls and affix the plastic waveguide to the PCB.

This Summary introduces simplified concepts of a solderable waveguide antenna that are further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

A solderable waveguide antenna, assemblies thereof, and associated methods are described with reference to the following drawings, which may use some of the same numbers throughout to reference like or examples of like features and components.

DETAILED DESCRIPTION

Overview

RF waveguide antennas (e.g., waveguides) are often attached to PCBs for various reasons (e.g., packaging, signal preservation, cost). Conventional techniques of affixation often rely on screws (or other fasteners) or pressure sensitive adhesives (PSA). While such techniques may affix the waveguides to the PCBs, they often fail to do so in a cost effective and/or precise manner (e.g., alignment and/or standoff heights of one or more apertures relative to the PCBs).

Described herein is a waveguide that is configured to be soldered to a PCB via one or more metallic portions disposed thereon. Additionally, the waveguide may have solder disposed within through holes that is configured to conduct heat from one or more components of the PCB, such as a Monolithic Microwave Integrated Circuit (MMIC), when the waveguide is mounted to the PCB. Also described herein is an assembly comprising the waveguide soldered to the PCB via solder between the metallic portions of the waveguide and metallic portions of the PCB. Techniques for producing the waveguide and the assembly are also described herein. For example, the metallic portions of the waveguide may be deposited onto a plastic body of the waveguide and such that the metallic portions may be soldered to corresponding metallic portions on the PCB.

By soldering the waveguide to the PCB, a cheap, precise, and secure mechanical bonding may be achieved while electrically sealing features of the waveguide (e.g., an aperture) and/or components of the PCB (e.g., a waveguide port, a MMIC). For example, ball grid arrays (e.g., solder balls) are low cost and easy to manufacture, can control aperture to port electrical isolation, and allow for a precise standoff height and alignment of the waveguide relative to the PCB. Furthermore, the solder within the through holes allows for better heat conduction through the waveguide than traditional waveguides.

Example Environment

Figure 1:
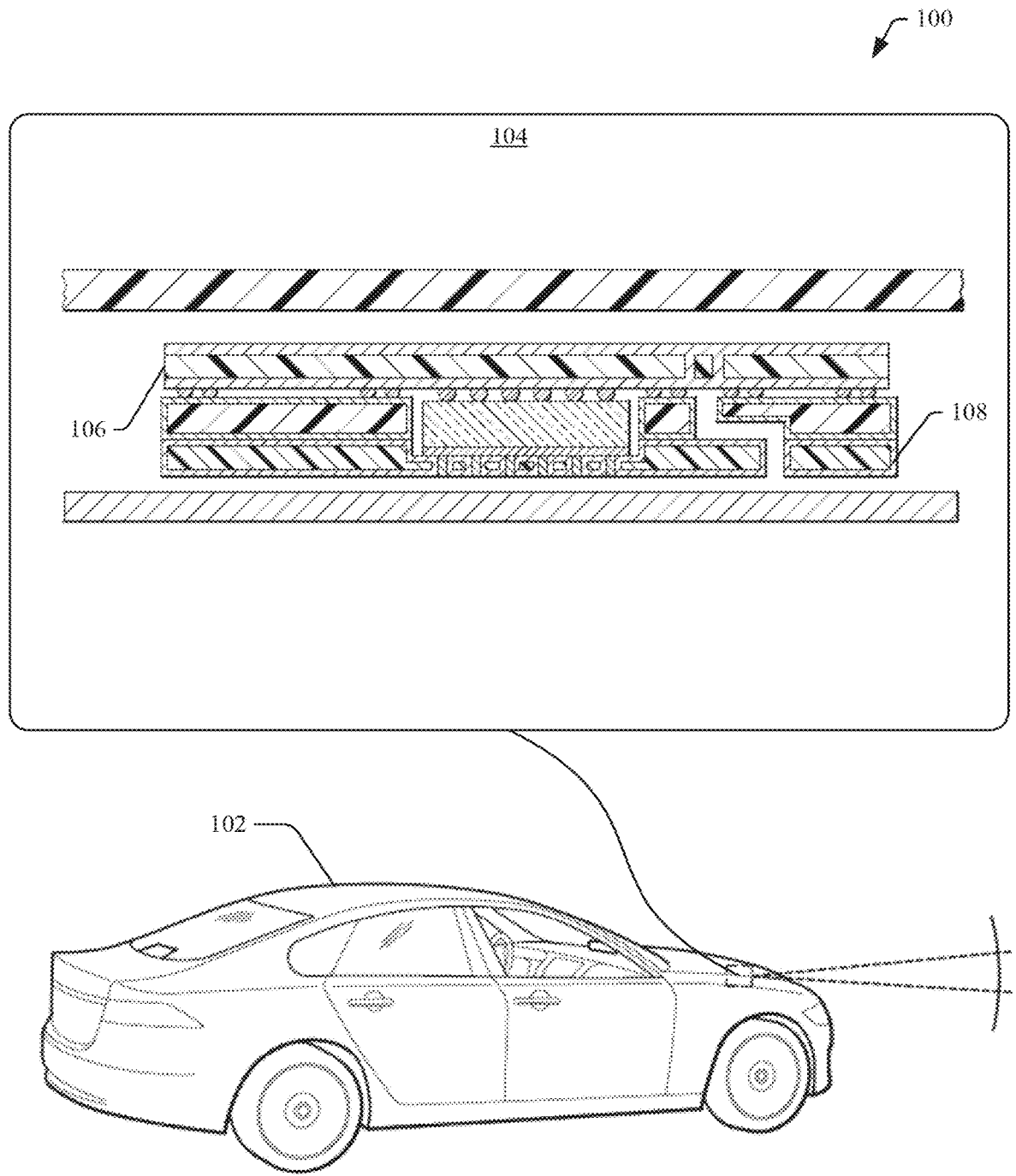
FIG. 1 illustrates, in accordance with this disclosure, an example environment where a solderable waveguide antenna may be implemented.

FIG. 1 illustrates an example environment 100 where a solderable waveguide antenna may be implemented. The example environment 100 contains a vehicle 102. The vehicle 102 may be any vehicle type (taxi, car, truck, motorcycle, e-bike, boat, air vehicle, and so on). The vehicle 102 contains an RF assembly 104 comprising a PCB 106 and a waveguide antenna 108 attached thereto. The RF assembly 104 may be configured for any type of RF communication (e.g., V2X, 5G, radar). For example, the RF assembly 104 may be configured as a radar assembly where the waveguide antenna 108 is configured for transmission and/or reception of radar signals. The waveguide antenna 108 may be configured as an air waveguide antenna, a dielectric filled waveguide, have multiple antennas and/or channels, or otherwise be configured as any other waveguide known to those in the art. The PCB 106 may be a bare circuit board or have one or more components attached thereto (e.g., a MIMIC) prior to assembly with the waveguide antenna 108

Although shown as being disposed within the vehicle 102, it should be noted that the RF assembly 104 may be configured for other environments. For example, the RF assembly 104 may be configured for a residential environment, commercial environment, mobile or stationary environment, marine environment, and/or space environment.

Example Assembly

Figures 2, 2A:
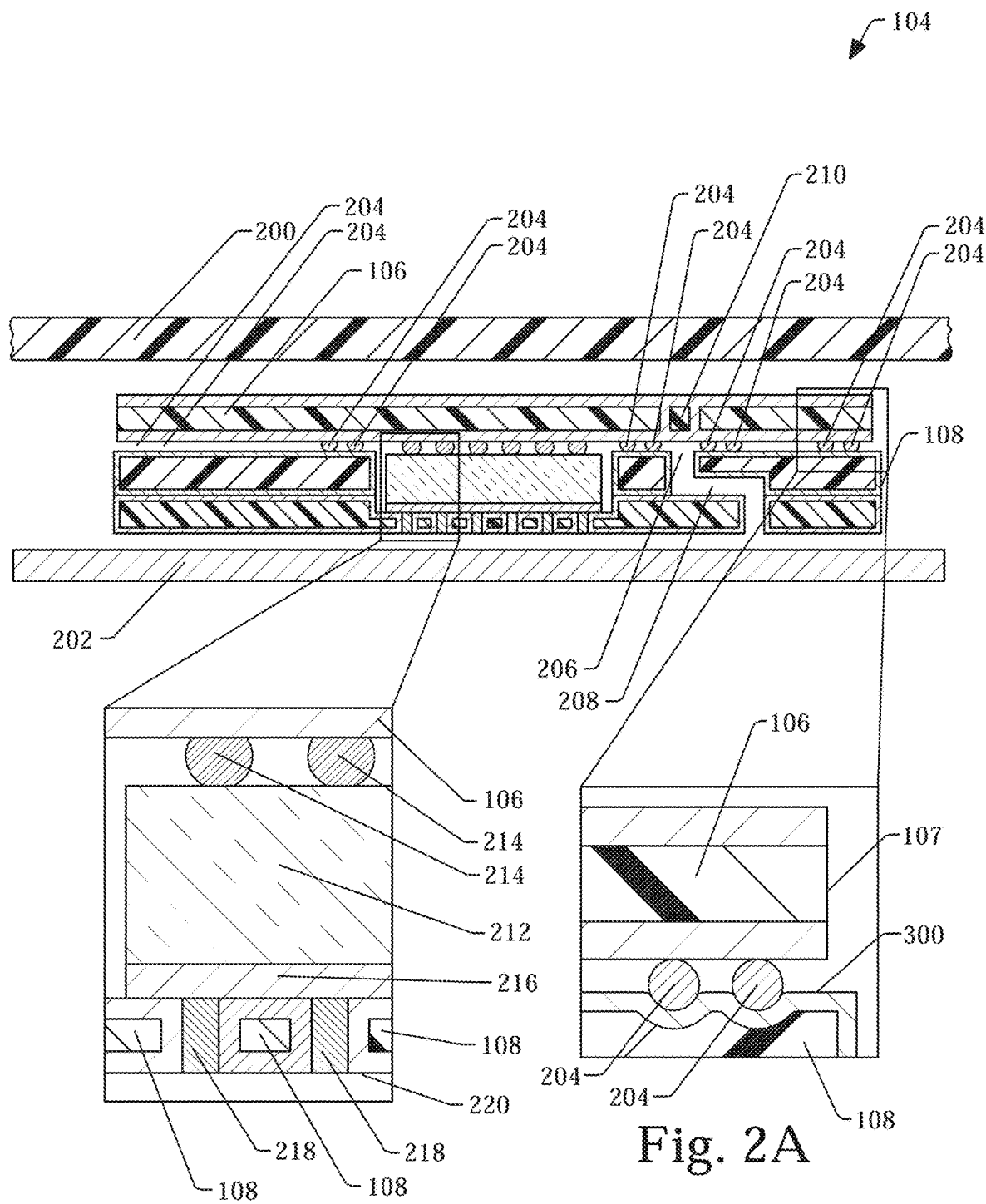
FIG. 2 illustrates, in accordance with this disclosure, a cross section of an assembly of a solderable waveguide antenna.
FIG. 2A illustrates, in accordance with this disclosure, a detailed cross section of the assembly of a solderable waveguide antenna.

FIG. 2 illustrates a cross section of the RF assembly 104. The RF assembly 104 has the PCB 106 and the waveguide antenna 108. In the illustrated example, the RF assembly 104 also has an enclosure 200 and a radome 202. The waveguide antenna 108 is at least partially formed of a plastic material with one or more metallic portions 300 disposed thereon, as discussed further in regard to FIG. 3. The PCB 106 also has metallic portions 107 that correspond to the metallic portions of the waveguide antenna 108, such that the waveguide antenna 108 can be attached to the PCB 106 via solder 204 between the corresponding metallic portions. The solder 204 may be any type of solder. In order to not melt the plastic material of the waveguide antenna 108, the solder 204 may be a low melting point solder, such as Sn/Bi or In/Sn.

Although the solder 204 is illustrated as circular cross sections between the waveguide antenna 108 and the PCB 106, the solder 204 may take any shape after the solder has been reflowed (e.g., melted) to create the RF assembly 104. For example, the solder 204 may start as solder balls (e.g., a ball grid array on the waveguide antenna 108 and/or the PCB 106) and flow under heat to produce the RF assembly 104, such that the solder 204 forms one or more contiguous portions. The contiguous portions may surround (or at least partially surround) an aperture 206 of a waveguide channel 208 of the waveguide antenna 108, such that the aperture 206 and/or a corresponding RF port 210 of the PCB 106 may be electrically sealed, for example, protected or shielded from Electro Magnetic Interference (EMI).

In the illustrated example, a monolithic microwave integrated circuit (MMIC) 212 is attached to the PCB 106 via solder 214. The solder 214 may be a different solder than that of solder 204. For example, the solder 214 may be a higher temperature solder because the MMIC 212 may not have the same thermal restrictions as the plastic material of the waveguide antenna 108. It should be noted that the MMIC 212 may be mounted/soldered to the PCB 106 prior to the waveguide antenna 108 being attached to the PCB 106.

Opposite the solder 214 on the MMIC 212 is a thermal interface material (TIM) 216. Within the waveguide antenna 108 and proximate the TIM 216 is solder 218. The solder 218 may contact the TIM 216 and provide a path for heat conduction between the TIM 216 and an external surface 220 of the waveguide antenna 108. As such, the cavities in which the solder 218 is disposed may be considered as thermal vias through the waveguide antenna 108 (e.g., through holes). In this way, the RF assembly 104 may provide better cooling of the MMIC 212 than the use of a waveguide antenna that does not have the solder 218.

Example Waveguide Antenna

Figure 3:
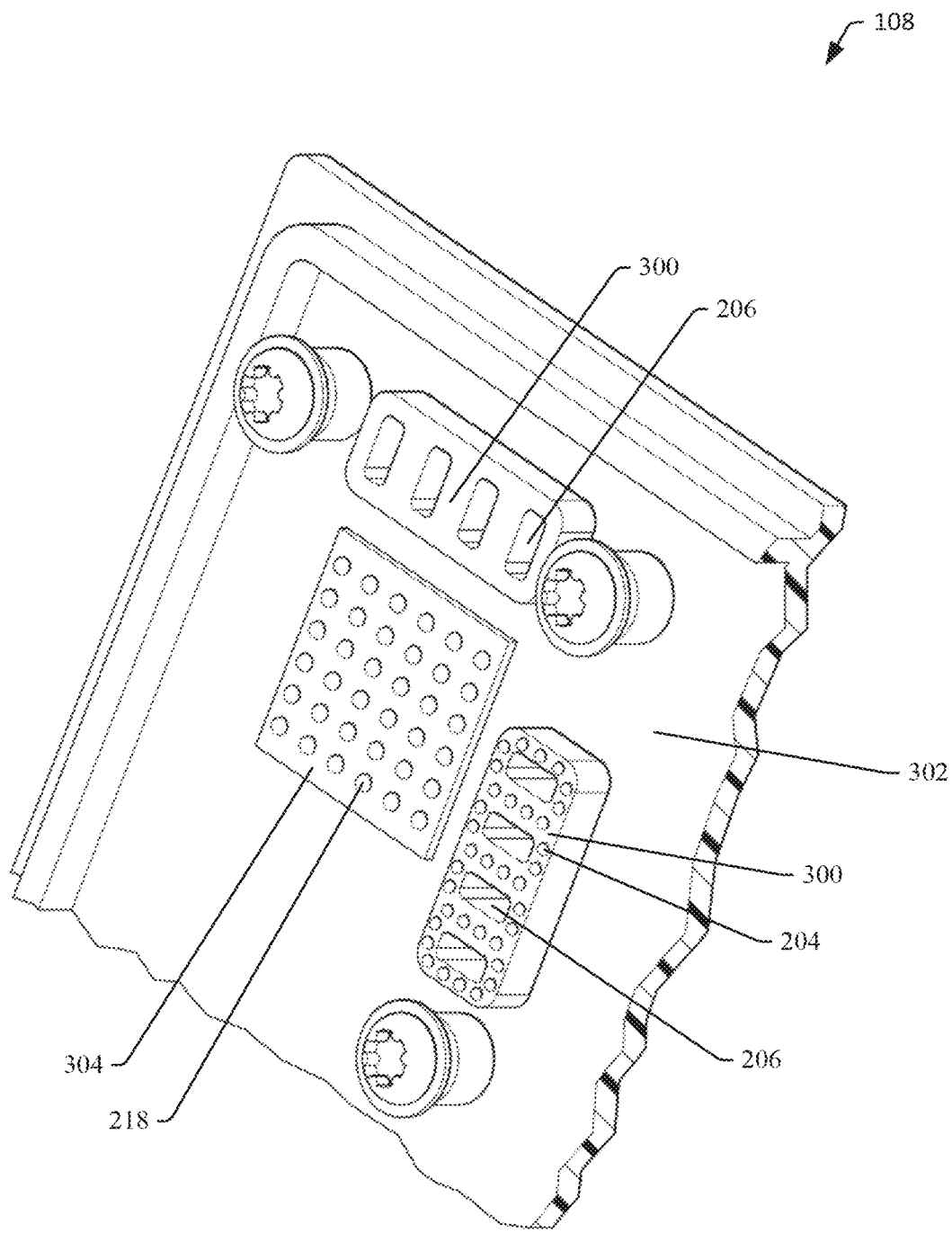
FIG. 3 illustrates, in accordance with this disclosure, a view of a solderable waveguide antenna with solder balls attached thereto.

FIG. 3 illustrates the waveguide antenna 108 with some of the solder 204 and the solder 218 disposed thereon. FIG. 3 illustrates the waveguide antenna 108 as it may be configured for attachment to the PCB 106.

The waveguide antenna 108 has a plurality of apertures 206 in multiple locations. It should be noted that any configuration of apertures 206 (including height from a surface of the waveguide antenna 108) may be used without departing from the scope of this disclosure.

Surrounding some of the apertures 206 is the solder 204. The solder 204 may be disposed in an array around and in between the apertures 206. The solder 204 may be attached to waveguide metallic portions 300 disposed on a plastic body 302 of the waveguide antenna 108. As shown in FIG. 2A, the waveguide metallic portions 300 (e.g., depositions of the solderable metal) may cover dimples of the plastic body 302 underneath the solder 204 (e.g., a dimple for each solder ball of the solder 204). The dimples may be in-molded dimples (e.g., part of the plastic body 302) which enable the solder 204 to stay in a specific location. The solder 204 at least partially surrounds the apertures 206 in order to provide shielding after assembly with the PCB 106.

It should be noted that solder 204 may be disposed on both waveguide metallic portions 300 in the illustrated example; however, some of the solder 204 is not shown (e.g., in the upper waveguide metallic portion 300) to better illustrate the corresponding waveguide metallic portion 300 and the surface to which it is disposed.

Also illustrated is a surface 304 and the solder 218 disposed therethrough (e.g., within thermal vias). The surface 304 is configured to be proximate the MMIC 212, such that the solder 218 can contact the TIM 216. For example, the surface 304 may be flush, raised (as illustrated), or tilted relative to an adjacent surface depending upon the configuration of the MMIC 212 or any other component that can benefit from the heat transfer provided by the solder 218. The surface 304 may also be within a cutout or recess formed by the apertures 206 and/or other portions of the plastic body 302 (e.g., for packaging) such that the MMIC 212 may be surrounded (e.g., on a plurality of sides) by the waveguide antenna 108 when the waveguide antenna 108 is assembled to the PCB 106. In other words, the MMIC 212 (or any other component of the PCB 106) may be at least partially encapsulated by the waveguide antenna 108 when assembled. Accordingly, the waveguide antenna 108 may have any number and/or configuration of surfaces 304 for respective components.

Depending on implementation, the surface 304 may have a waveguide metallic portion 300 disposed thereon or not. A waveguide metallic portion 300 on the surface 304 may enable better heat transfer between portions of the solder 218.

Example Methods

Figure 4:
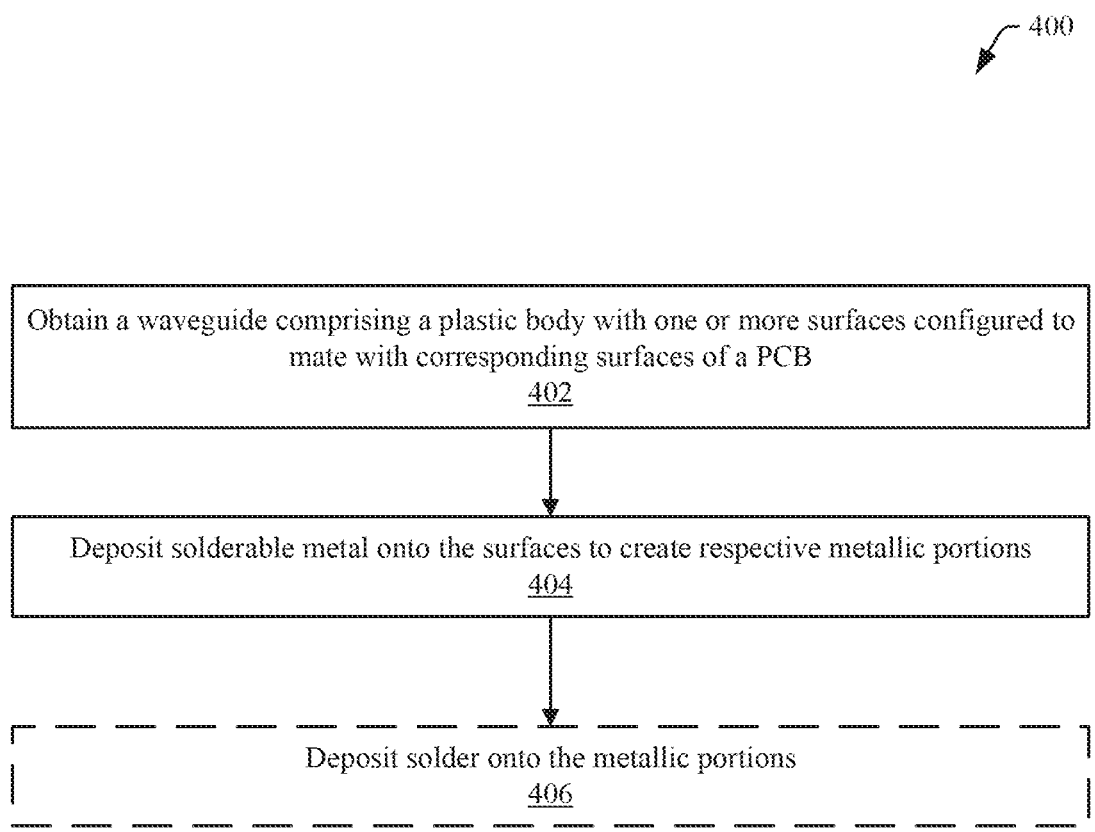
FIG. 4 illustrates, in accordance with this disclosure, an example method of manufacturing a solderable waveguide antenna.

FIG. 4 is an example method 400 of manufacturing a solderable waveguide antenna. At 402, a waveguide comprising a plastic body with one or more surfaces configured to mate with corresponding surfaces of a PCB is obtained. For example, the plastic body 302 of the waveguide antenna 108 may be obtained with surfaces corresponding to the waveguide metallic portions 300 (but without the waveguide metallic portions 300 disposed thereon).

At 404, a solderable metal is deposited onto the surfaces to create respective metallic portions. The metallic portions are solderable features for the solder 204. For example, a conductive and/or solderable metal (e.g., copper, tin, silver, or an alloy thereof) may be deposited, such as via a Physical Vapor Deposition (PVD), onto the surfaces of the plastic body 302 to create depositions which form the waveguide metallic portions 300 (e.g., physical vapor depositions). A blocking screen may be used such that locations of the waveguide metallic portions 300 may be controlled (e.g., only around apertures 206, around the surface 304 to electrically seal/shield the MMIC 212, in other locations for structure mounting to the PCB 106). The waveguide metallic portions 300 may cover dimples of the plastic body 302 used to house/locate solder.

Optionally, at 406, solder is deposited onto the metallic portions. For example, the solder 204 may be deposited on the waveguide metallic portions 300 within the dimples (e.g., metallurgically bonded). The solder 204 may form a ball grid array and be deposited/adhered to the waveguide metallic portions 300 via various known processes. The solder 204 may be deposited as 0.2 to 0.5 mm balls and placed at a pitch (e.g., distance from each other). By placing the solder 204 onto the waveguide antenna 108, the waveguide antenna 108 may be ready for assembly with the PCB 106. It should be noted that the solder 204 may be deposited to the PCB 106, either alternatively or in conjunction, or as part of the assembly process.

As part of step 406, or in addition to it, solder may also be deposited within thermal vias of the plastic body (if the waveguide is configured with such). For example, the solder 218 may be deposited within the through holes of the plastic body 302 (e.g., proximate the TIM 216, proximate the MMIC 212).

Figure 5:
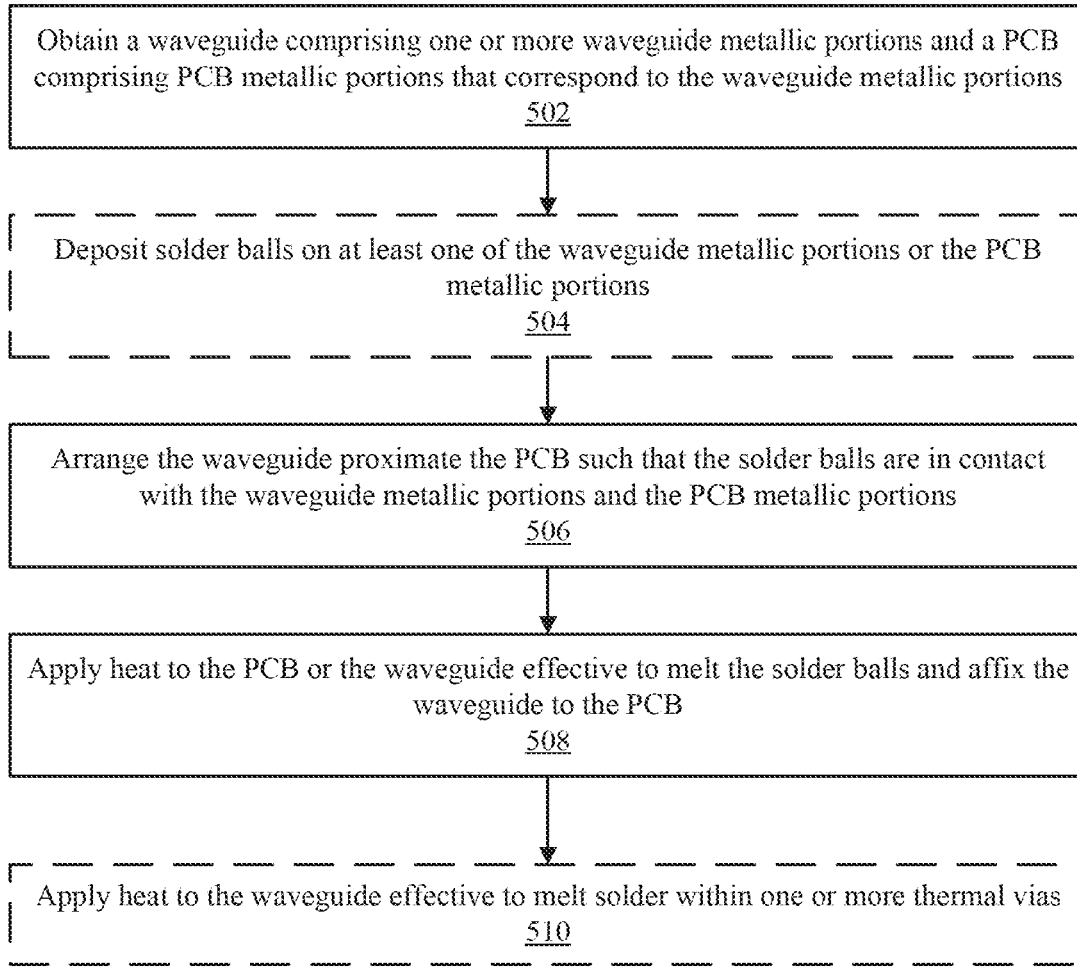
FIG. 5 illustrates, in accordance with this disclosure, an example method of attaching a solderable waveguide antenna to a PCB.

FIG. 5 is an example method 500 of attaching a solderable waveguide antenna to a PCB. At 502, a waveguide comprising one or more waveguide metallic portions and a PCB comprising PCB metallic portions that correspond to the waveguide metallic portions are obtained. For example, the waveguide antenna 108 (with the waveguide metallic portions 300) and the PCB 106 (with its metallic portions) may be obtained.

Optionally, at 504, solder balls are deposited on at least one of the waveguide metallic portions or the PCB metallic portions. Depending upon implementation, the solder balls may already be disposed on one or both of the waveguide metallic portions or the PCB metallic portions (e.g., as part of manufacturing the respective parts), thereby obviating step 504. For example, if it doesn't already exist, the solder 204 may be deposited on the waveguide metallic portions 300 or the PCB metallic portions of the PCB 106.

At 506, the waveguide is arranged proximate the PCB such that the solder balls are in contact with the waveguide metallic portions and the PCB metallic portions. For example, the waveguide antenna 108 may be arranged proximate the PCB 106 such that the apertures 206 are aligned with respective RF ports 210. The locations of the waveguide metallic portions 300 and the corresponding PCB metallic portions align when the apertures 206 and RF ports 210 are aligned with each other (e.g., due to locations of the respective metallic portions relative to the apertures 206 and RF ports 210).

At 508, heat is applied to the PCB or the waveguide which causes the solder balls to melt, thereby affixing the waveguide to the PCB. While heating, the arrangement of the PCB and the waveguide may be maintained, such that proper alignment (e.g., aperture to RF port standoff and alignment) is maintained. For example, heat may be applied to the PCB 106 or the waveguide antenna 108 effective to melt the solder 204. The heat may be a low temp reflow heat, such as 160° C. The alignment of the apertures 206 to their respective RF ports 210 may be maintained during the heating process.

Optionally, at 510, heat is applied to the waveguide effective to melt solder within one or more thermal vias. Step 510 may be performed if the waveguide contains the thermal vias. For example, heat may be applied to the waveguide antenna 108 effective to melt the solder 218 into the thermal vias of the surface 304 such that the solder 218 is thermally connected to an underlying component (e.g., the MMIC 212 via the TIM 216). The solder 218 may then provide a heat transfer path from the underlying component to an external surface (e.g., the external surface 220).

FURTHER EXAMPLES

Some additional examples of a sheet metal enclosure with an array of extruded heat transfer holes and a method related thereto are provided below.

Example 1: An assembly comprising: a printed circuit board (PCB) comprising: a radio frequency (RF) port; and one or more PCB metallic portions; a waveguide comprising a waveguide channel with an aperture aligned with the RF port of the PCB; and one or more waveguide metallic portions disposed on one or more external surfaces of the waveguide, the waveguide metallic portions corresponding to the PCB metallic portions; and solder disposed between the waveguide metallic portions and the PCB metallic portions.

Example 2: The assembly of example 1, wherein the solder at least partially surrounds the RF port.

Example 3: The assembly of example 2, wherein the solder is configured to provide electromagnetic interference (EMI) shielding for the RF port.

Example 4: The assembly of example 1, wherein: the waveguide is formed of a plastic material; and the waveguide metallic portions are a solderable metal disposed on the plastic material of the external surfaces.

Example 5: The assembly of example 4, wherein the solderable metal comprises copper, tin, silver, or an alloy thereof.

Example 6: The assembly of example 4, wherein the waveguide metallic portions comprise depositions of the solderable metal on the plastic material.

Example 7: The assembly of example 6, wherein the depositions of the solderable metal comprise physical vapor depositions (PVD).

Example 8: The assembly of example 1, wherein: the waveguide comprises dimples on the external surfaces; and the waveguide metallic portions and the solder are disposed within the dimples.

Example 9: The assembly of example 1, wherein: the PCB comprises a monolithic microwave integrated circuit (MMIC); and the waveguide comprises: a cutout configured to surround the MMIC; and through holes disposed within the cutout.

Example 11: The assembly of example 9, further comprising solder disposed within the through holes and thermally connected to a thermal interface material (TIM) of the MMIC.

Example 11: The assembly of example 9, further comprising solder disposed within the thru holes and thermally connected to a thermal interface material (TIM) of the MMIC.

Example 12: The assembly of example 9, wherein the solder is configured to provide electromagnetic (EMI) shielding for the MMIC.

Example 13: The assembly of example 1, wherein the solder comprises a tin/bismuth, indium/tin, or other low melting point solder.

Example 14: A radio frequency (RF) waveguide comprising: a plastic body comprising: a waveguide channel with an aperture configured to mate with a corresponding RF port of a printed circuit board (PCB); and a plurality of dimples on one or more external surfaces of the plastic body; and one or more waveguide metallic portions disposed on the dimples.

Example 15: A method comprising: obtaining a plastic waveguide comprising a plurality of dimples; depositing solderable metal on the dimples to form one or more waveguide metallic portions; obtaining a printed circuit board (PCB) comprising one or more PCB metallic portions; at least one of: adhering solder balls to the waveguide metallic portions proximate the dimples; or adhering solder balls to the PCB metallic portions; arranging the plastic waveguide proximate the PCB such that the solder balls are in contact with the waveguide metallic portions and the PCB metallic portions; and applying heat to the PCB or the plastic waveguide effective to melt the solder balls and affix the plastic waveguide to the PCB.

Example 16: The method of example 15, wherein depositing the solderable metal on the dimples comprises a physical vapor deposition (PVD) process.

Example 17: The method of example 15, wherein: the PCB comprises a monolithic microwave integrated circuit (MMIC); and arranging the plastic waveguide comprises arranging the plastic waveguide such that the plastic waveguide at least partially surrounds the MIMIC.

Example 18: The method of example 17, wherein: the plastic waveguide comprises a plurality of through holes; and the method further comprises: placing solder within the through holes; and applying heat to the plastic waveguide effective to melt the solder.

Example 19: The method of example 18, wherein: the through holes are proximate the MMIC; and applying the heat to the plastic waveguide comprises causing the solder to flow to a thermal interface material (TIM) of the MMIC.

Example 20: The method of example 15, wherein: one of the waveguide metallic portions or a plurality of the waveguide metallic portions surrounds an aperture of the plastic waveguide; and applying heat to the PCB or the plastic waveguide causes the solder balls to form an electromagnetic interference (EMI) shield for the aperture.

Example 21: A method of manufacturing the assembly of any of examples 1-13.

Example 22: A method of manufacturing the RF waveguide of example 14.

Example 23: A system configured to perform the method of any of examples 15-20.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. An assembly comprising:
   a printed circuit board (PCB) comprising:
      a radio frequency (RF) port; and
      one or more PCB metallic portions;
   a waveguide including a plastic body comprising a waveguide channel with an aperture aligned with the RF port of the PCB, the plastic body including a plurality of dimples on one or more external surfaces of the plastic body and one or more waveguide metallic portions disposed on the dimples of the waveguide, the waveguide metallic portions corresponding to the PCB metallic portions; and
   solder disposed between the waveguide metallic portions and the PCB metallic portions, wherein the solder at least partially surrounds the RF port and is configured to provide electromagnetic interference (EMI) shielding for the RF port.

2. The assembly of claim 1, wherein:
   the waveguide metallic portions are a solderable metal disposed on the plastic material of the external surfaces.

3. The assembly of claim 2, wherein the solderable metal comprises copper, tin, silver, or an alloy thereof.

4. The assembly of claim 2, wherein the waveguide metallic portions comprise depositions of the solderable metal on the plastic material.

5. The assembly of claim 4, wherein the depositions of the solderable metal comprise physical vapor depositions (PVD).

6. The assembly of claim 1, wherein the solder comprises a tin/bismuth, indium/tin, or other low melting point solder.

* * * * *